(12) United States Patent
Azuma et al.

(10) Patent No.: US 10,014,112 B2
(45) Date of Patent: Jul. 3, 2018

(54) CAPACITOR AND MODULE

(71) Applicant: Kyocera Corporation, Kyoto-shi, Kyoto (JP)

(72) Inventors: Yusuke Azuma, Kirishima (JP); Hidenobu Seki, Kirishima (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 15/544,136

(22) PCT Filed: Jan. 26, 2016

(86) PCT No.: PCT/JP2016/052153
§ 371 (c)(1),
(2) Date: Jul. 17, 2017

(87) PCT Pub. No.: WO2016/121745
PCT Pub. Date: Aug. 4, 2016

(65) Prior Publication Data
US 2018/0012702 A1   Jan. 11, 2018

(30) Foreign Application Priority Data
Jan. 29, 2015 (JP) ................................. 2015-015633

(51) Int. Cl.
*H01G 4/30* (2006.01)
*H05K 1/18* (2006.01)
*H01G 4/248* (2006.01)

(52) U.S. Cl.
CPC ............ *H01G 4/30* (2013.01); *H01G 4/248* (2013.01); *H05K 1/181* (2013.01); *H05K 2201/10015* (2013.01)

(58) Field of Classification Search
CPC .......... H01G 4/005; H01G 4/008; H01G 4/30; H01G 4/232; H01G 4/228; H01G 4/248; H01G 4/252; H01G 4/242
See application file for complete search history.

(56) References Cited

U.S. PATENT DOCUMENTS

2005/0081987 A1   4/2005 Takahara et al.
2013/0250480 A1*  9/2013 Ahn ....................... H01G 4/129
                                                361/321.2
(Continued)

FOREIGN PATENT DOCUMENTS

JP   2002-289456 A   10/2002
JP   2005-123288 A   5/2005

OTHER PUBLICATIONS

International Search Report (Form PCT/ISA/210) issued for PCT/JP2016/052153, dated Apr. 12, 2016.
(Continued)

*Primary Examiner* — Nguyen Ha
(74) *Attorney, Agent, or Firm* — Volpe and Koenig, P.C.

(57) ABSTRACT

The capacitor includes a dielectric body portion including ceramic layers and internal-electrode layers laminated in an alternating manner, and a cover portion provided in a periphery of the dielectric body portion. The cover portion includes pores. A part of the cover portion located in a position in a direction perpendicular to a lamination direction of the ceramic layers and the internal-electrode layers is a side surface cover portion. When the side surface cover portion is divided into three equal regions in a width direction, the regions being a dielectric body portion-side region, a central region, and a surface-side region, the number of the pores is higher in the dielectric body portion-side region than in the central region and the surface-side region.

9 Claims, 9 Drawing Sheets

(56) References Cited

U.S. PATENT DOCUMENTS

| | | | | |
|---|---|---|---|---|
| 2014/0063683 A1* | 3/2014 | Gu | ............... | H01G 4/30 |
| | | | | 361/301.4 |
| 2015/0016018 A1* | 1/2015 | Onishi | ............ | H01G 4/005 |
| | | | | 361/301.4 |
| 2015/0085422 A1* | 3/2015 | Kim | ............ | H01G 4/2325 |
| | | | | 361/301.4 |
| 2015/0090483 A1* | 4/2015 | Moon | ............ | H01G 4/30 |
| | | | | 174/260 |
| 2015/0116900 A1* | 4/2015 | Sawada | ........... | H01G 4/012 |
| | | | | 361/301.4 |

OTHER PUBLICATIONS

Written Opinion (Form PCT/ISA/237) issued for PCT/JP2016/052153, dated Apr. 12, 2016.

* cited by examiner

CAPACITOR AND MODULE

TECHNICAL FIELD

The present disclosure relates to a capacitor and a module on which the capacitor is mounted.

BACKGROUND ART

Capacitors have functions for controlling electrical current and voltage in electronic circuits, or function as secondary batteries, and are therefore used in many kinds of electronic equipment.

Multilayer ceramic capacitors, film capacitors, aluminum electrolytic capacitors, and tantalum capacitors can be given as examples of capacitors.

Of these types of capacitors, multilayer ceramic capacitors have both smaller sizes and higher electrostatic capacitances than other capacitors. Therefore, demand for multilayer ceramic capacitors continues to increase for use in small-sized electronic equipment such as mobile telephones.

Figure 9A:
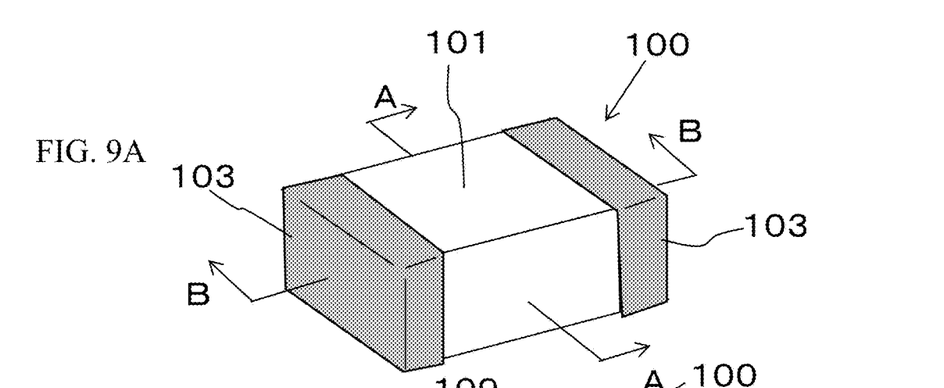
FIG. 9A is a perspective view schematically illustrating a conventional multilayer ceramic capacitor.
Figure 9B:
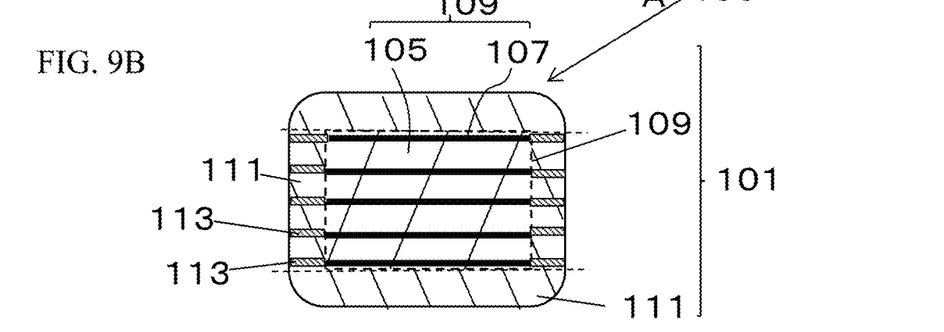
FIG. 9B is a cross-sectional view taken from a line A-A in FIG. 9A.
Figure 9C:
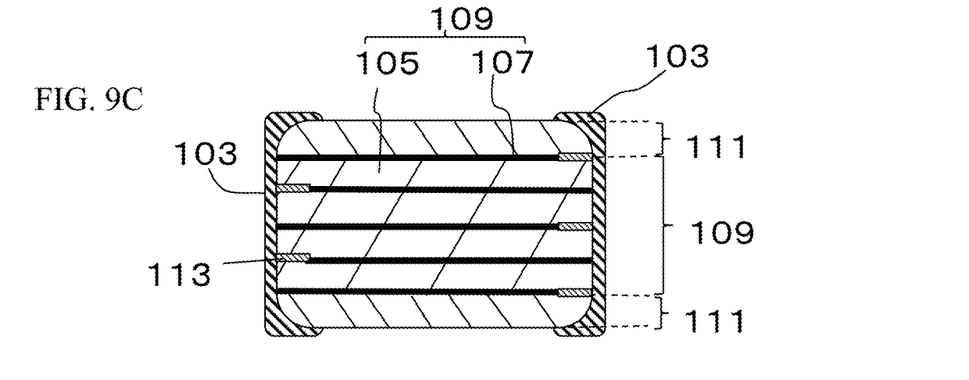
FIG. 9C is a cross-sectional view taken from a line B-B in FIG. 9A.

FIG. 9A is a perspective view schematically illustrating a typical multilayer ceramic capacitor, FIG. 9B is a cross-sectional view taken from a line A-A in FIG. 9A, and FIG. 9C is a cross-sectional view taken from a line B-B in FIG. 9A.

A multilayer ceramic capacitor 100 is constituted of a capacitor body 101 and external electrodes 103 provided on both end portions of the capacitor body 101. The multilayer ceramic capacitor will be referred to simply as a "capacitor" hereinafter.

The capacitor body 101 includes a dielectric body 109 constituted of ceramic layers 105 and internal-electrode layers 107 laminated in an alternating manner, and a cover portion 111 provided around the periphery of the dielectric body 109.

Upon a voltage being applied to the capacitor, an electrostrictive effect arises in a lamination direction in which the dielectric body 109 extends. However, at this time, the electrostrictive effect does not arise in the cover portion 111 provided in the periphery of the dielectric body 109. Distortion thus arises between the dielectric body 109 and the cover portion 111, which can lead to delamination at parts within the cover portion 111 where the distortion is concentrated (see Patent Document 1, for example).

CITATION LIST

Patent Literature

Patent Literature 1: Japanese Unexamined Patent Application Publication No. 2002-289456A

SUMMARY OF INVENTION

Technical Problem

An object of the present invention is to provide a capacitor capable of suppressing the occurrence of delamination and a highly-reliable module using the same.

Solution to Problem

A capacitor according to the present disclosure includes a dielectric body portion including ceramic layers and internal-electrode layers laminated in an alternating manner, and a cover portion provided in a periphery of the dielectric body portion.

In this capacitor, the cover portion includes pores, and a part of the cover portion located in a position in a direction perpendicular to a lamination direction of the ceramic layers and the internal-electrode layers is a side surface cover portion.

Additionally, in this capacitor, when the side surface cover portion is divided into three equal regions in a width direction, the regions being a dielectric body portion-side region, a central region, and a surface-side region, the number of the pores is higher in the dielectric body portion-side region than in the central region and the surface-side region.

A module according to the present disclosure includes a capacitor mounted on a surface of a wiring board, and the capacitor is the above-described capacitor.

Advantageous Effects of Invention

According to the capacitor and the module of the present disclosure, a capacitor in which delamination does not easily occur can be obtained, and as a result, a highly-reliable module can be obtained as well.

DESCRIPTION OF EMBODIMENTS

Figure 1A:
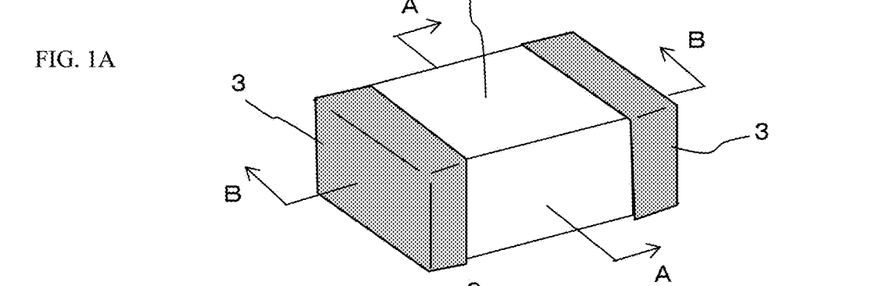
FIG. 1A is a perspective view schematically illustrating a first embodiment of a capacitor according to the present disclosure.
Figure 1B:
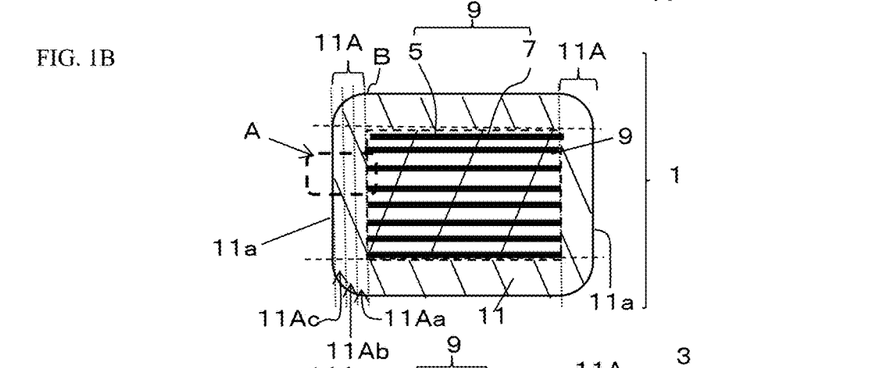
FIG. 1B is a cross-sectional view taken from a line A-A in FIG. 1A.
Figure 1C:
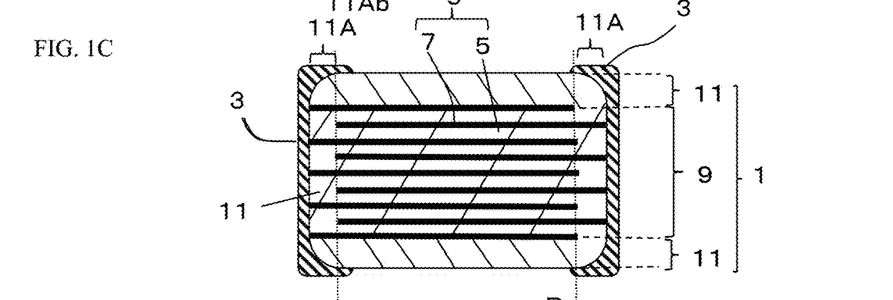
FIG. 1C is a cross-sectional view taken from a line B-B in FIG. 1A.
Figure 1D:
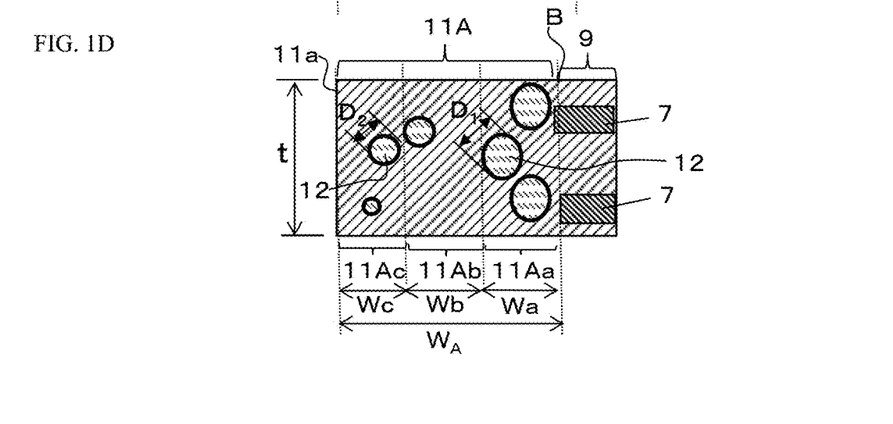
FIG. 1D is a schematic cross-sectional view illustrating the vicinity of a cover portion in FIG. 1B (an area A) in an enlarged manner.

FIG. 1A is a perspective view schematically illustrating a first embodiment of a capacitor according to the present disclosure, FIG. 1B is a cross-sectional view taken from a line A-A in FIG. 1A, and FIG. 1C is a cross-sectional view taken from a line B-B in FIG. 1A. FIG. 1D is a schematic cross-sectional view illustrating the vicinity of a cover portion in FIG. 1A (an area A) in an enlarged manner.

The capacitor includes a capacitor body 1 and external electrodes 3 provided on both opposing end portions of the capacitor body 1.

The capacitor body 1 includes a dielectric body portion 9 and a cover portion 11 provided in the periphery around the dielectric body portion 9.

The dielectric body portion 9 is constituted of ceramic layers 5 and internal-electrode layers 7 laminated in an alternating manner.

Here, the dielectric body portion 9 is a site that contributes to the production of electrostatic capacitance. The cover portion 11 is a site that does not produce electrostatic capacitance. The cover portion 11 is formed from porcelain containing the same primary component as the ceramic layers 5. However, the cover portion 11 may have a different composition from the ceramic layers 5 as long as the capacitor meets the desired dielectric characteristics and mechanical characteristics.

Of the cover portion 11, cover portions 11A located on the side faces perpendicular to the lamination direction of the ceramic layers 5 and the internal-electrode layers 7 will be referred to as side surface cover portions 11A.

Meanwhile, the cover portion 11 provided on a top surface side and a bottom surface side of the dielectric body portion 9 will be referred to as outer layer cover portions 11B.

Pores 12 are present in the cover portion 11 that constitutes the capacitor body 1. The pores 12 are defined as being not less than 0.1 μm in diameter. In this case, the diameters of the pores 12 correspond to the diameters of the openings of the pores 12 in a cross-section of the cover portion 11.

For example, when a region such as that indicated in FIG. 1D is observed under an electron microscope, the pores 12 exhibit a different color from the porcelain of the cover portion 11, and can be confirmed on the basis thereof. The electron microscope observation is carried out at a magnification of from 2000 to 5000×.

A method that divides the side surface cover portion 11A into three equal parts in a width direction, as indicated in FIGS. 1B and 1D, is employed to describe the characteristic parts of the capacitor.

Here, a width $W_A$ of the side surface cover portion 11A is, as illustrated in FIG. 1D, an interval from a boundary B between the dielectric body portion 9 and the side surface cover portion 11A to an outer surface 11a of the side surface cover portion 11A.

The regions obtained by dividing the side surface cover portion 11A into three equal parts along the width $W_A$ direction are, from the dielectric body portion 9 side, a dielectric body portion-side region 11Aa, a central region 11Ab, and a surface-side region 11Ac.

Widths of the dielectric body portion-side region 11Aa, the central region 11Ab, and the surface-side region 11Ac are represented by reference signs Wa, Wb, and Wc, respectively.

In this capacitor, the dielectric body portion-side region 11Aa includes more of the pores 12 than the central region 11Ab and the surface-side region 11Ac.

Having a different number of the pores 12 refers to a case where the number of the pores 12 in the dielectric body portion-side region 11Aa is not less than 1.2 times the number of the pores 12 in the central region 11Ab and the number of the pores 12 in the surface-side region 11Ac.

In the conventional capacitor, the ceramic layers 105 and the internal-electrode layers 107 are made thinner, and in a capacitor in which the area ratio and number of layers for the internal-electrode layers 107 is increased, there are still situations where delamination arises in the cover portion 111.

As opposed to this, according to the capacitor of the first embodiment, the number of the pores 12 in the dielectric body portion-side region 11Aa is greater than the numbers of the pores 12 in the central region 11Ab and the surface-side region 11Ac, and thus regions of the side surface cover portion 11A near the dielectric body portion 9 have a lower rigidity.

Accordingly, when a voltage is applied to the capacitor, distortion arising between the dielectric body portion 9 and the side surface cover portion 11A can be reduced even in the case where the dielectric body portion 9 has extended in the lamination direction due to the electrostrictive effect.

As a result, a situation in which delamination arises in the side surface cover portion 11A can be suppressed.

In this case, in the above-described capacitor, a structure in which the number of the pores 12 gradually increases from the surface-side region 11Ac toward the dielectric body portion-side region 11Aa may be employed. This makes it possible to enhance the effect of alleviating the influence of distortions received by the side surface cover portion 11A from the dielectric body portion 9 throughout the side surface cover portion 11A as a whole.

Note that the surface-side region 11Ac of the side surface cover portion 11A is extremely fine, and thus the capacitor has high moisture resistance.

The number of the pores 12 can be found by observing a cross-section of the capacitor using a scanning electron microscope and analyzing a photograph captured by the microscope.

Specifically, the capacitor is processed to have a cross-section such as that illustrated in FIG. 1B, and then a photograph is taken of a predetermined region, as indicated in FIG. 1D. Next, based on this photograph, the side surface cover portion 11A is divided into three equal parts in the direction of the width $W_A$ so as to set the dielectric body portion-side region 11Aa, the central region 11Ab, and the surface-side region 11Ac. The number of the pores 12 in each of those regions is then counted. At this time, the regions in which the pores 12 are counted are located at the same height in the lamination direction. This is the position of an interval t indicated in FIG. 1D. In this case, pores 12 present on the lines drawn to define the regions are not counted.

According to this capacitor, the probability of delamination arising in the capacitor can be further reduced by ensuring that an average diameter $D_1$ of the pores 12 in the dielectric body portion-side region 11Aa is greater than an average diameter $D_2$ of the pores 12 in the surface-side region 11Ac.

With the capacitor according to the present disclosure, the following configurations can be added to the above-described configuration of the first embodiment.

Figure 2A:
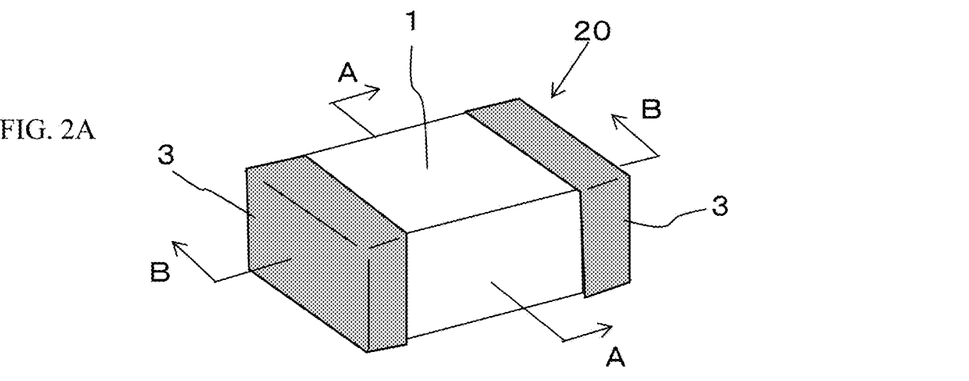
FIG. 2A is a perspective view schematically illustrating a capacitor according to a second embodiment.
Figure 2B:
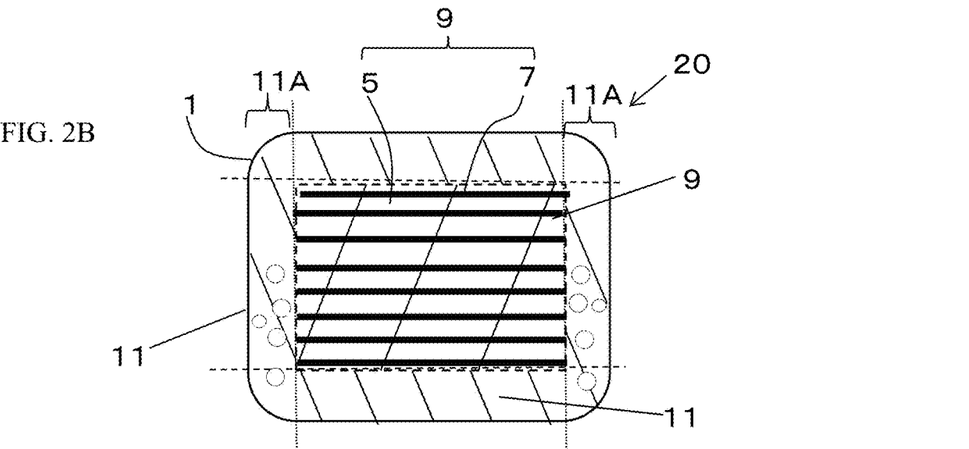
FIG. 2B is a cross-sectional view taken from a line A-A in FIG. 2A.
Figure 2C:
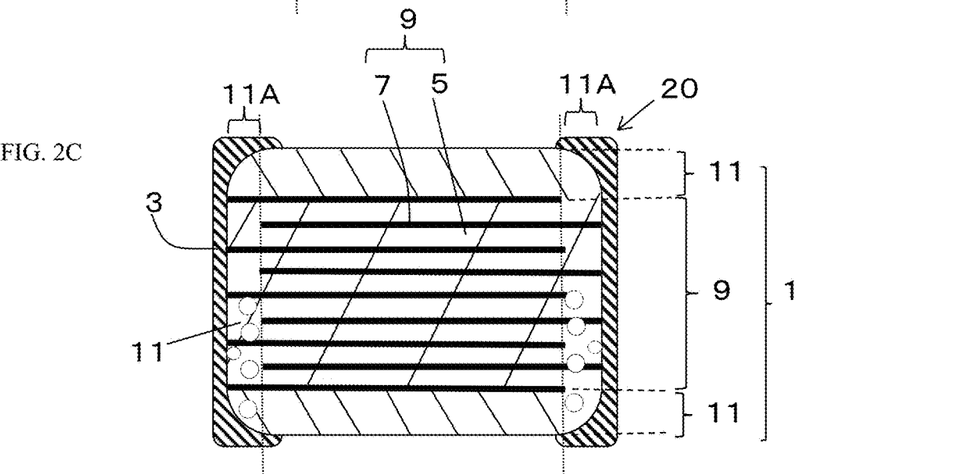
FIG. 2C is a cross-sectional view taken from a line B-B in FIG. 2A.

FIG. 2A is a perspective view schematically illustrating a capacitor according to a second embodiment, FIG. 2B is a cross-sectional view taken from a line A-A in FIG. 2A, and FIG. 2C is a cross-sectional view taken from a line B-B in FIG. 2A.

Figure 3A:
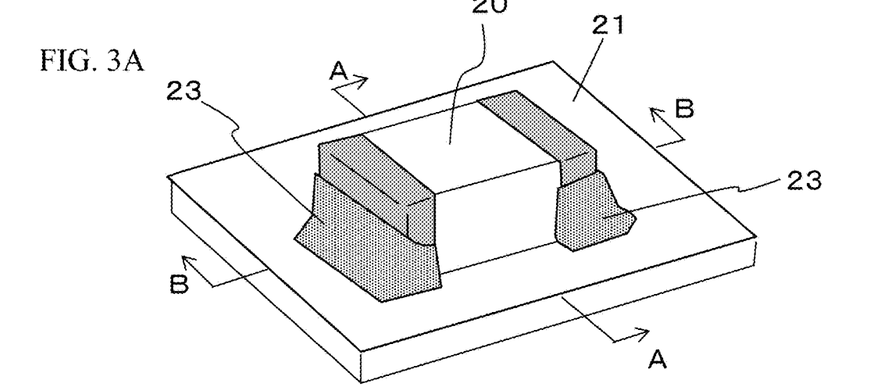
FIG. 3A is a perspective view schematically illustrating part of a module obtained by mounting a capacitor on the surface of a wiring board, as an example of an electronic component.
Figure 3B:
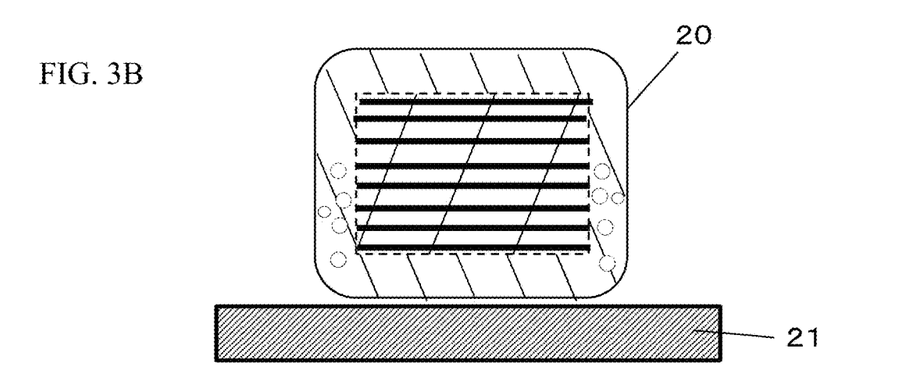
FIG. 3B is a cross-sectional view taken from a line A-A in FIG. 3A.
Figure 3C:
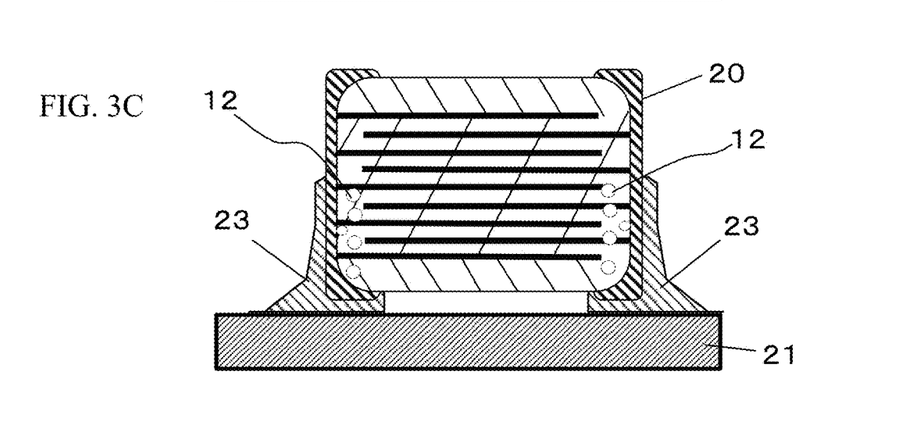
FIG. 3C is a cross-sectional view taken from a line B-B in FIG. 3A.

FIG. 3A is a perspective view schematically illustrating part of a module in which a capacitor is mounted on the surface of a wiring board, FIG. 3B is a cross-sectional view taken from a line A-A in FIG. 3A, and FIG. 3C is a cross-sectional view taken from a line B-B in FIG. 3A.

As illustrated in FIGS. 2B and 2C, with the capacitor according to the second embodiment, the porosity of the side surface cover portion 11A that constitutes the capacitor body 1 differs between a top layer side and a bottom layer side obtained by the dividing the dielectric body portion 9 into two equal parts in the lamination direction.

In other words, with the capacitor according to the second embodiment, the number of the pores 12 present within the side surface cover portion 11A is skewed toward one side when the dielectric body portion 9 is viewed in the lamination direction.

In addition to the above-described structure of the first embodiment, the number of the pores 12 in the side surface cover portion 11A constituting the capacitor body 1 may differ in the lamination direction as well. As such, in a case where the capacitor is restrained on one side in the lamination direction and stress arises in the capacitor, the pores 12 present within the side surface cover portion 11A make it possible to alleviate that stress.

For example, in the case where a capacitor 20 is fixed to the surface of a wiring board 21 using a bonding member 23 such as solder as indicated in FIGS. 3A, 3B, and 3C, the capacitor 20 is restrained by the bonding member 23. Between the wiring board 21 side and the opposite side in the lamination direction of the capacitor 20, the restraining force is greater on the wiring board 21 side.

In such a case, a large stress may arise in the capacitor 20 and, depending on the situation, cracks may form in the capacitor 20.

In the capacitor 20 according to the second embodiment, the pores 12 present in the side surface cover portion 11A are skewed toward one side. When mounting the capacitor 20 on the wiring board 21, the capacitor 20 is mounted such that the side with more of the pores 12 is closer to the surface of the wiring board 21.

In other words, when the capacitor 20 is mounted on the surface of the wiring board 21 as indicated in FIGS. 3A, 3B, and 3C, stress arising in the capacitor 20 can be alleviated by the pores 12 present within the side surface cover portion 11A on the wiring board 21 side thereof.

As a result, a situation in which cracks form in the capacitor 20 can be suppressed.

A capacitor 30 according to a third embodiment and a capacitor 40 according to a fourth embodiment, which will be described below, have the following configurations added to the above-described configuration of the first embodiment and the above-described configuration of the second embodiment, respectively.

Figure 4A:
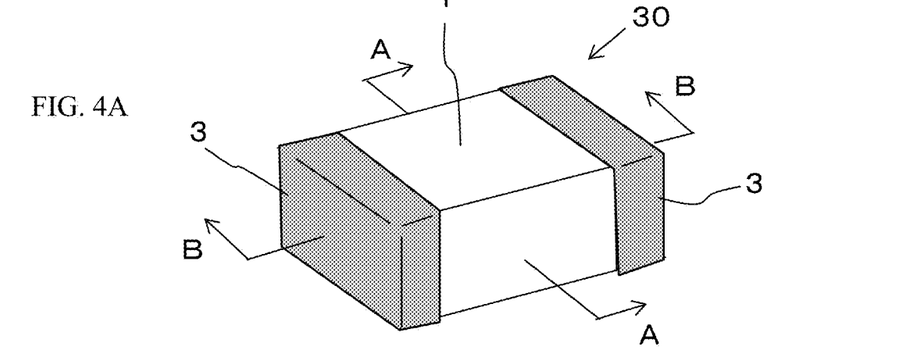
FIG. 4A is a perspective view schematically illustrating a capacitor according to a third embodiment.
Figure 4B:
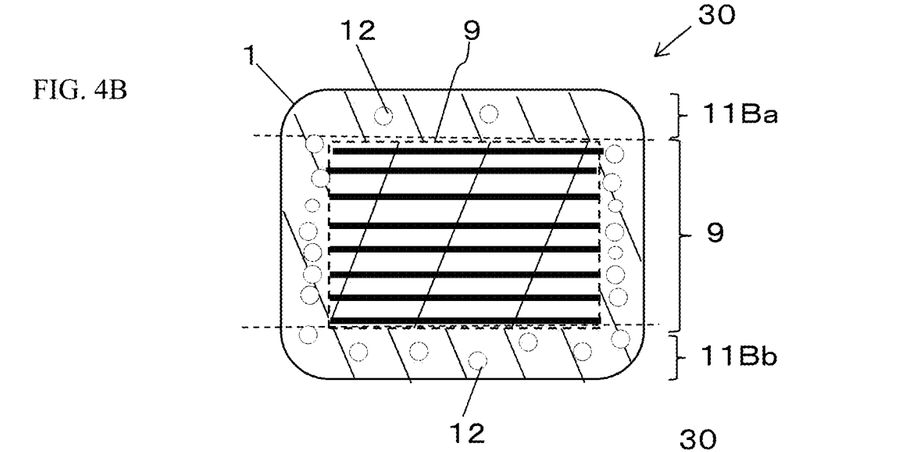
FIG. 4B is a cross-sectional view taken from a line A-A in FIG. 4A.
Figure 4C:
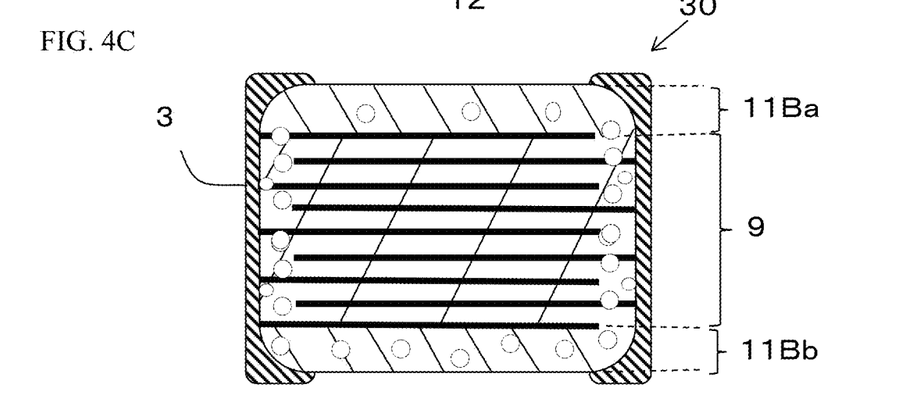
FIG. 4C is a cross-sectional view taken from a line B-B in FIG. 4A.

FIG. 4A is a perspective view schematically illustrating a capacitor according to the third embodiment, FIG. 4B is a cross-sectional view taken from a line A-A in FIG. 4A, and FIG. 4C is a cross-sectional view taken from a line B-B in FIG. 4A.

The capacitor 30 according to the third embodiment is based on the configuration of the first embodiment. As illustrated in FIGS. 3B and 3C, in the capacitor 30, when two cover portions, of the cover portion 11, that are located on a top surface side and a bottom surface side in the lamination direction of the dielectric body portion 9 are taken as outer layer cover portions 11Ba and 11Bb, the number of the pores 12 or the porosity differs between the two outer layer cover portions 11Ba and 11Bb. In the following, only the number of the pores 12 may be referred to.

In addition to the above-described structure of the first embodiment, the number of the pores 12 or the porosity in the outer layer cover portion 11B constituting the capacitor body 1 may differ between the top surface side and the bottom surface side of the dielectric body portion 9, as is the case with the capacitor 30. In this case, disposing the outer layer cover portion 11Ba or 11Bb having the higher porosity or the higher number of the pores 12 on the wiring board 21 side makes it possible to reduce stress in the case where one side of the capacitor in the lamination direction is restrained and stress arises within the capacitor 30. Accordingly, a situation in which cracks form in the capacitor 30 can be suppressed.

Figure 5A:
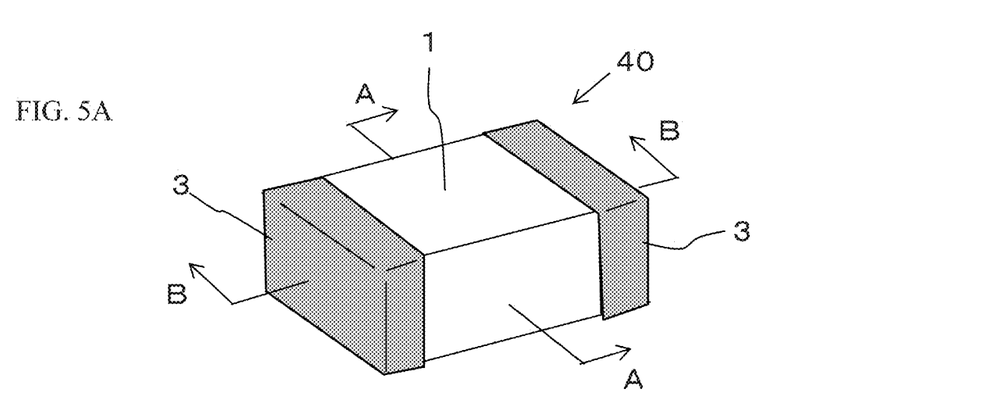
FIG. 5A is a perspective view schematically illustrating a capacitor according to a fourth embodiment.
Figure 5B:
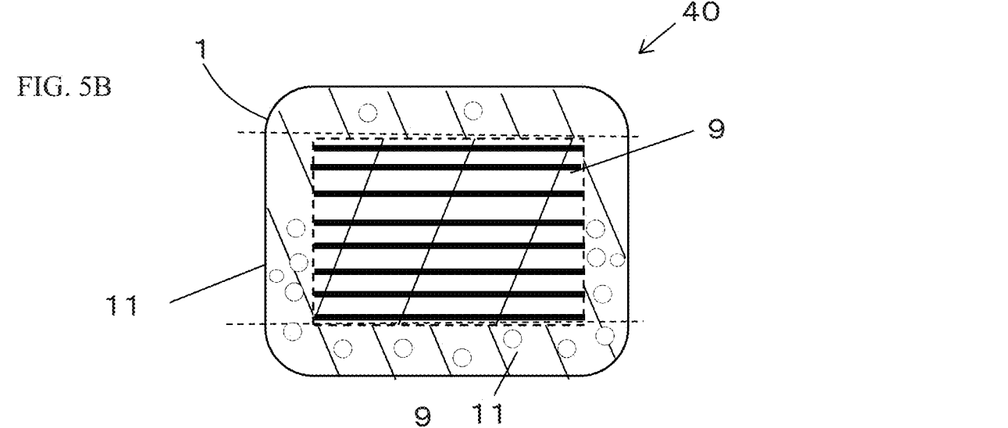
FIG. 5B is a cross-sectional view taken from a line A-A in FIG. 5A.
Figure 5C:
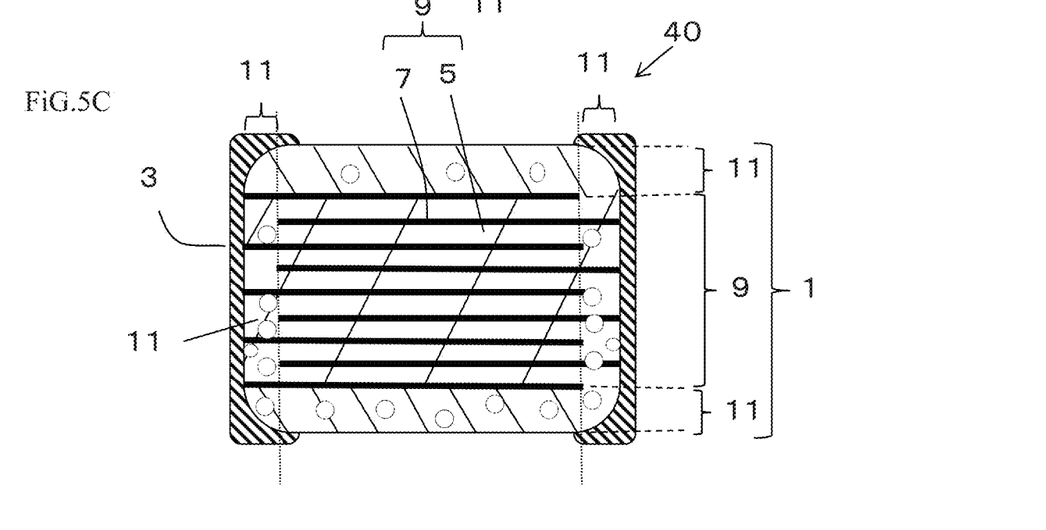
FIG. 5C is a cross-sectional view taken from a line B-B in FIG. 5A.

FIG. 5A is a perspective view schematically illustrating a capacitor according to the fourth embodiment, FIG. 5B is a cross-sectional view taken from a line A-A in FIG. 5A, and FIG. 5C is a cross-sectional view taken from a line B-B in FIG. 5A.

The capacitor 40 according to the fourth embodiment is based on the configuration of the second embodiment. In the capacitor 20 illustrated in FIGS. 4B and 4C too, the outer layer cover portions 11Ba and 11Bb located on the top surface side and the bottom surface side in the lamination direction of the dielectric body portion 9 have the same configurations as the outer layer cover portions 11Ba and 11Bb according to the above-described third embodiment.

In other words, in the capacitor 40, the porosity or the number of the pores 12 differs between the two outer layer cover portions 11Ba and 11Bb located on the top surface side and the bottom surface side in the lamination direction of the dielectric body portion 9.

This capacitor 40 can achieve the same effects as the capacitor 30 according to the third embodiment.

A capacitor 50 according to a fifth embodiment, which will be described below, has the following configurations added to the above-described configuration of the fourth embodiment.

Figure 6A:
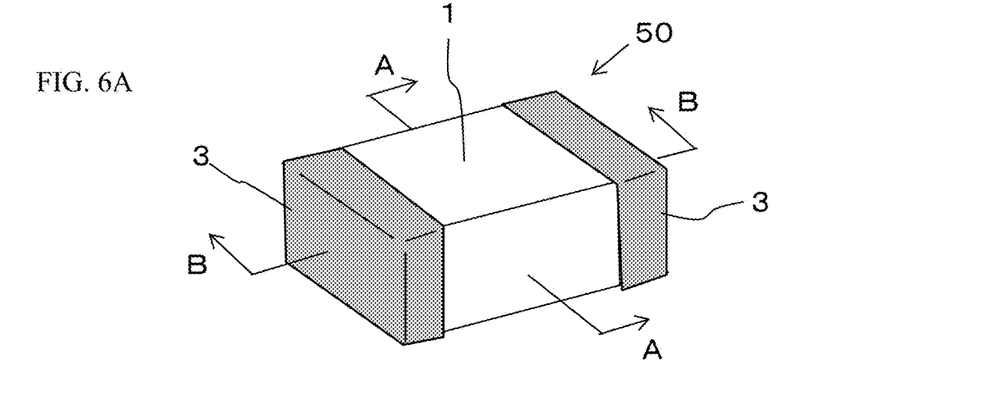
FIG. 6A is a perspective view schematically illustrating a capacitor according to a fifth embodiment.
Figure 6B:
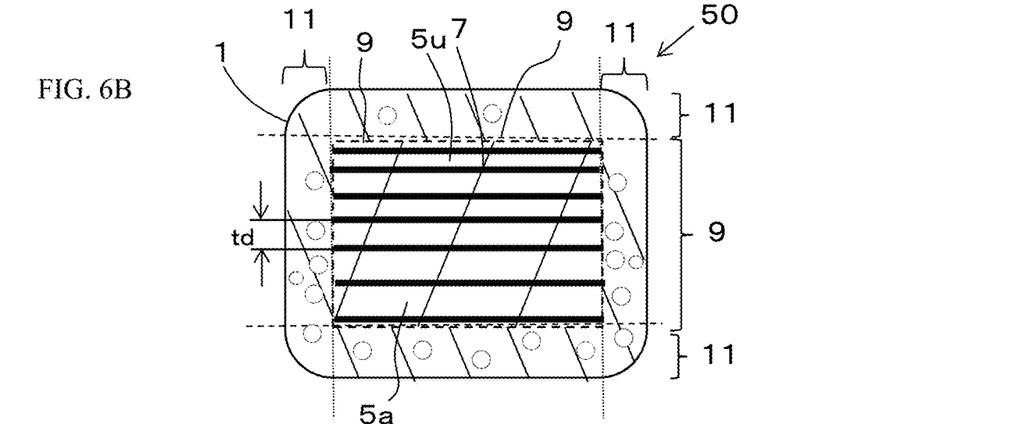
FIG. 6B is a cross-sectional view taken from a line A-A in FIG. 6A.
Figure 6C:
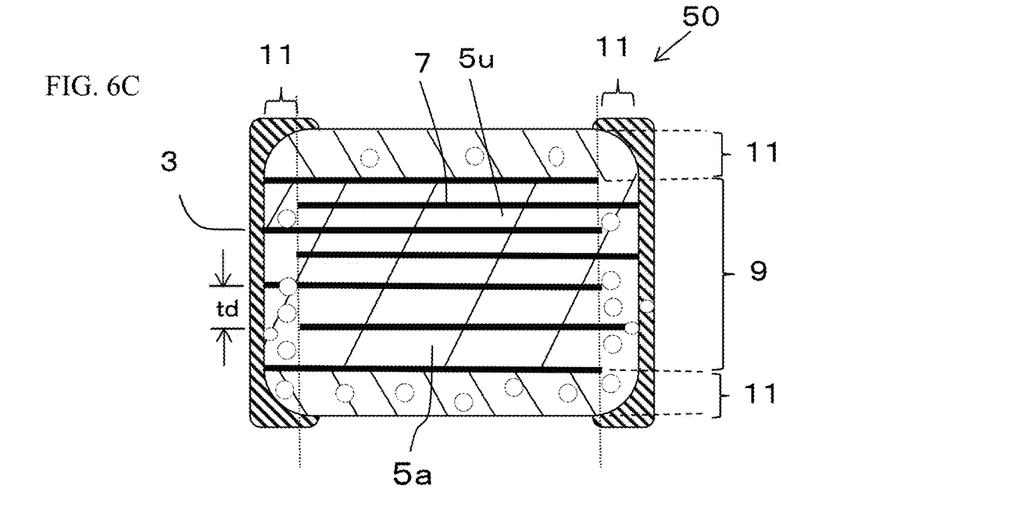
FIG. 6C is a cross-sectional view taken from a line B-B in FIG. 6A.

FIG. 6A is a perspective view schematically illustrating a capacitor according to the fifth embodiment, FIG. 6B is a cross-sectional view taken from a line A-A in FIG. 6A, and FIG. 6C is a cross-sectional view taken from a line B-B in FIG. 6A.

The capacitor 50 according to the fifth embodiment includes ceramic layers 5, in the dielectric body portion 9, having a different thickness td from other ceramic layers 5. In FIGS. 6B and 6C, the ceramic layer having a higher thickness td is indicated by reference sign 5a, whereas the ceramic layer having a lower thickness td is indicated by reference sign 5u.

In FIGS. 6A, 6B, and 6C, the ceramic layer 5a having a higher thickness td is disposed on the side where the outer layer cover portion 11A having the higher number of the pores 12 or the higher porosity is located. The ceramic layer 5u having a lower thickness td is disposed on the side where the outer layer cover portion 11A having the lower number of the pores 12 or the lower porosity is located.

In the dielectric body portion 9, the lower the thicknesses of the ceramic layers 5 and the internal-electrode layers 7 and the greater the number of laminated layers becomes, the greater the difference in the mechanical characteristics, produced by properties such as the thermal expansion coefficient, relative to the cover portion 11 becomes.

At parts where the thickness td of the ceramic layers 5 is higher, the thermal expansion coefficient of the dielectric body portion 9 can be brought closer to the thermal expansion coefficient of the cover portion 11 by an amount corresponding to that increase in the thickness td of the ceramic layers 5. Accordingly, stress arising locally between the cover portion 11 and the dielectric body portion 9 of the capacitor body 1 can be alleviated. As a result, the likelihood of cracks forming in the capacitor 50 can be reduced.

In the capacitors according to the above-described second to fifth embodiments, when viewing the dielectric body portion 9 along the lamination direction, the internal-electrode layers 7 located toward the side surface cover portion 11A and the outer layer cover portion 11B where there is a higher number of the pores 12 may have a lower level of continuity than the internal-electrode layers 7 located toward the side surface cover portion 11A and the outer layer cover portion 11B on the opposite side, where there is a lower number of the pores 12. This makes it possible to bring the thermal expansion coefficient of the dielectric body portion 9 closer to the thermal expansion coefficient of the cover portion 11 by the amount by which the internal-electrode layers 7 have become sparse. In such a case as well, stress arising locally between the cover portion 11 and the dielectric body portion 9 of the capacitor body 1 can be alleviated. As a result, the likelihood of cracks forming in the capacitor 50 can be reduced even more.

Here, the "continuity" of an internal-electrode layer 7 refers to whether or not the internal-electrode layer 7 has a broad active surface area. An internal-electrode layer 7 having a broad active surface area means that the continuity of that internal-electrode layer 7 is high. The continuity of an internal-electrode layer 7 can be determined by, for example, observing a cross-section of the dielectric body portion 9 such as that indicated in FIG. 1B and finding the percentage of the length of metal portions in each unit of length of the internal-electrode layers 7 exposed in that cross-section.

Figure 7A:
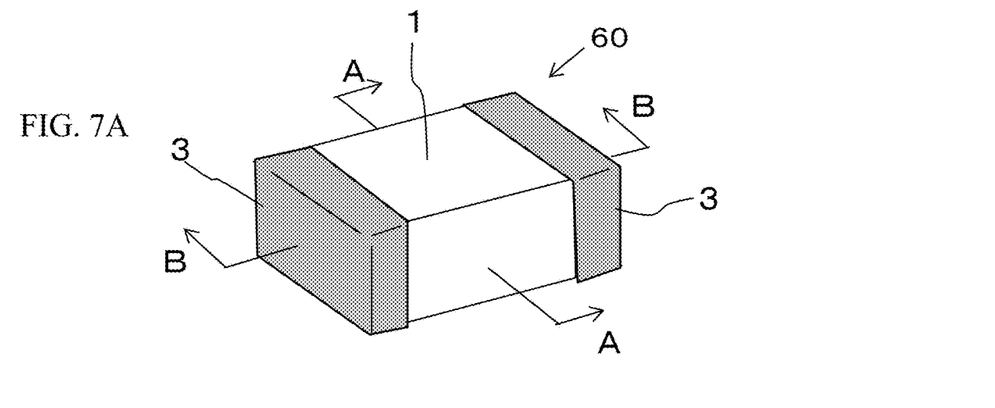
FIG. 7A is a perspective view schematically illustrating a capacitor according to a sixth embodiment.
Figure 7B:
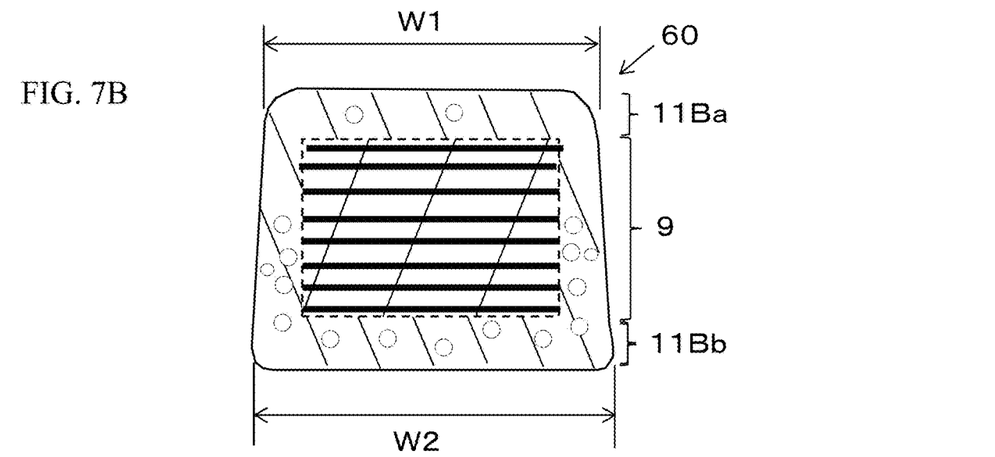
FIG. 7B is a cross-sectional view taken from a line A-A in FIG. 7A.
Figure 7C:
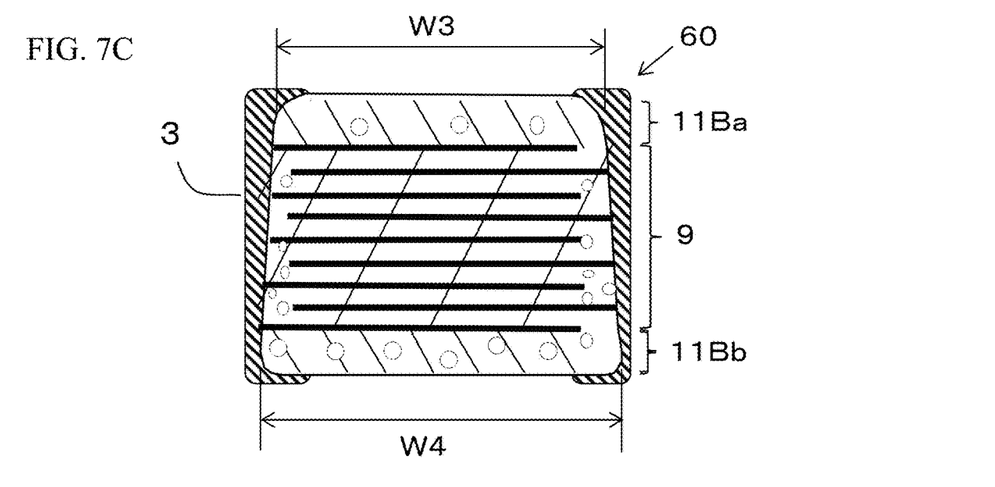
FIG. 7C is a cross-sectional view taken from a line B-B in FIG. 7A.

FIG. 7A is a perspective view schematically illustrating a capacitor according to a sixth embodiment, FIG. 7B is a cross-sectional view taken from a line A-A in FIG. 7A, and FIG. 7C is a cross-sectional view taken from a line B-B in FIG. 7A.

A capacitor 60 according to the sixth embodiment, which will be described below, has the following configurations added to the above-described configuration of the fourth embodiment.

In the capacitor 60 according to the sixth embodiment, a dimension W2 of the outer layer cover portion 11Bb, where the number of pores or the porosity is higher, is greater than a dimension W1 of the outer layer cover portion 11Ba located on the opposite side in the lamination direction relative to the outer layer cover portion 11Bb.

In this case, it is desirable that the lengths of the outer layer cover portions 11B be greater in at least one of a direction in which the pair of external electrodes 3 are arranged and a direction perpendicular to the direction in which the pair of external electrodes 3 are arranged, indicated in FIGS. 7B and 7C.

For example, as illustrated in FIGS. 7B and 7C, of the outer layer cover portions 11Ba and 11Bb disposed on the top surface side and the bottom surface side of the dielectric body portion 9, the length of the outer layer cover portion 11Bb, which has the higher porosity or the higher number of the pores 12, may be greater than the length of the outer layer cover portion 11Ba located on the opposite side therefrom. As such, even in the case where cracks have formed in the outer layer cover portion 11Bb, the extent of damage resulting from those cracks can be reduced by an amount corresponding to the increased volume of the outer layer cover portion 11Bb. The rate at which malfunctions occur due to such damage can thus be reduced.

In this case, it is desirable that the lengths of the outer layer cover portions 11B be greater in both the direction in which the pair of external electrodes 3 are arranged and the direction perpendicular to the direction in which the pair of external electrodes 3 are arranged, as illustrated in FIGS. 7B and 7C.

The capacitors 30, 40, 50, and 60 according to the third to sixth embodiments, respectively, have the same effects as the capacitor 20 according to the second embodiment in the case where the capacitors 30, 40, 50, and 60 are mounted on the surface of the wiring board 21 using a bonding member 23 such as solder.

Preferably, the material of the ceramic layers 5 and the cover portion 11 that constitute the capacitor is at least one type of a metal oxide selected from barium titanate, barium zirconate titanate, lead zirconate titanate, titanium dioxide, and the like, or a composite oxide. The thermal expansion coefficient of these materials is preferably from $9 \times 10^{-6}$ to $11 \times 10^{-6}/°$ C.

Preferably, one type of metal selected from nickel, copper, palladium, and silver, or an alloy thereof, is employed as the material of the internal-electrode layers 7. It is desirable that the thermal expansion coefficient of these metals be from $10 \times 10^{-6}$ to $20 \times 10^{-6}/°$ C.

Preferably, an average thickness of the ceramic layers 5 is from 0.5 to 3 μm, and an average thickness of the internal-electrode layers 7 is from 0.2 to 2 μm.

Preferably, there are not less than 100 of the internal-electrode layers 7 in the dielectric body portion 9, and when the thickness of the dielectric body portion 9 in the lamination direction is 1, the thickness of the cover portion 11 is from 0.01 to 0.1.

FIG. 8 is a schematic diagram illustrating a manufacturing method for the capacitor according to the present embodiment.

Figure 8A:
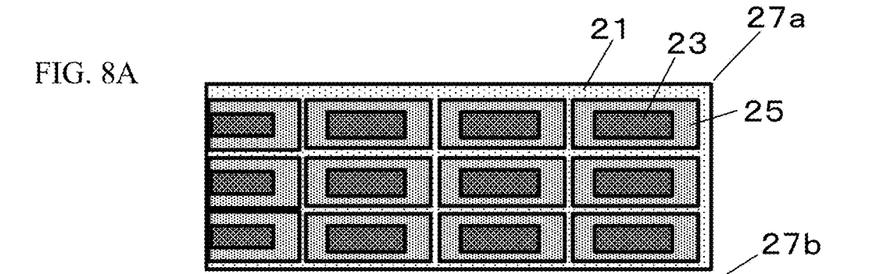
FIG. 8 is a schematic diagram illustrating a manufacturing method for the capacitor according to the present embodiment.
Figure 8B:
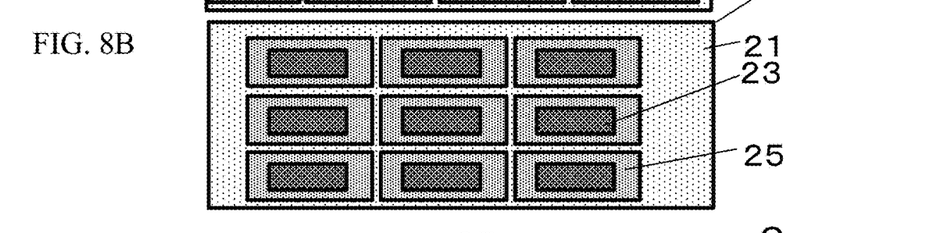
Figure 8C:
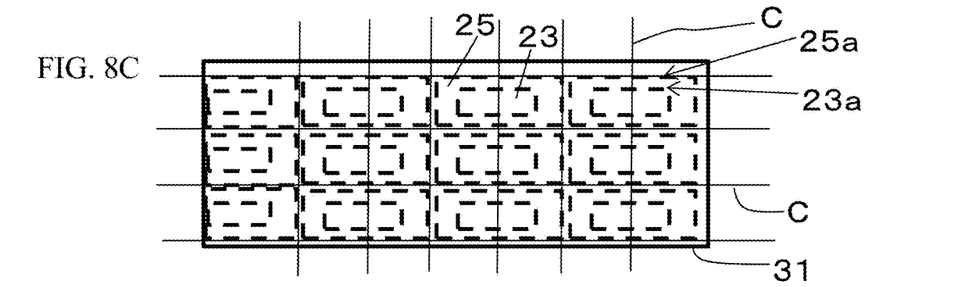
Figure 8D:
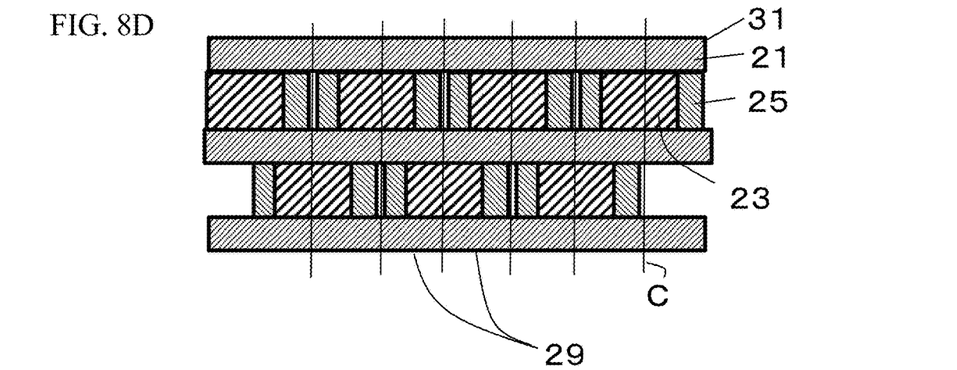

Here, FIGS. 8A and 8B are plan views of pattern sheets 27a and 27b that are laminated in an alternating manner. FIG. 8C is a plan view schematically illustrating a base laminated body 31 formed by laminating the pattern sheets 27a and 27b. FIG. 8C depicts a transparent state such that the positions where an internal-electrode pattern 23 and a ceramic pattern 25 are present can be seen. FIG. 8D is a cross-sectional view schematically illustrating the base laminated body 31 formed by laminating the pattern sheets 27a and 27b.

When manufacturing the capacitor according to the present embodiment, first, the pattern sheets 27a and 27b are created by forming the rectangular internal-electrode pattern 23, and the ceramic pattern 25 in the periphery of the internal-electrode pattern 23, on the main surface of a ceramic green sheet 21 containing a dielectric body powder that takes barium titanate, for example, as a primary component, as illustrated in FIGS. 8A and 8B.

A core laminated body is then formed by stacking a plurality of layers of the pattern sheets 27a and 27b. Next, a predetermined number of the ceramic green sheets 21 in which conductor patterns are not formed are stacked on a top surface side and a bottom surface side of the core laminated body. This is then subjected to pressurized heat-treatment so as to form the base laminated body 31 containing a plurality of laminated bodies 29, each of which will serve as the capacitor body 1.

Next, the base laminated body 31 is cut along cutting lines C, indicated in FIGS. 8C and 8D, to produce the laminated bodies 29.

A laser processing machine is used to cut the laminated bodies 29 at this time. The laser processing machine cuts by applying heat to the ceramic pattern 25. The content of organic resin in the ceramic pattern 25, between peripheral edges 25a of the ceramic pattern 25 near the cutting lines C and peripheral edges 23a of the internal-electrode pattern 23 distanced from the peripheral edges 25a, can be changed as a result.

At this time, the ceramic particles constituting the ceramic pattern 25 are sintered slightly. The number of the pores 12 between the peripheral edges 25a of the ceramic pattern 25 (the surface 11a of the cover portion 11) and peripheral edges 23a of the internal-electrode pattern 23 distanced therefrom (the dielectric body portion 9) can be changed as a result.

In the case where the state in which the pores 12 are formed in the side surface cover portion 11A, such as a case where number of the pores 12 in the dielectric body portion-side region 11Aa of the side surface cover portion 11A is made greater than the number of the pores 12 in the central region 11Ab and the surface-side region 11Ac, a case where the side surface cover portion 11A is formed such that the number of the pores 12 increases from the surface-side region 11Ac to the dielectric body portion-side region 11Aa, or a case where the average diameter of the pores 12 in the dielectric body portion-side region 11Aa is made greater than the average diameter of the pores 12 in the surface-side region 11Ac, the output of the laser processing machine is varied.

In the case where the dielectric portion 9 is divided into two equal parts in the lamination direction, and the number of the pores 12 in the side surface cover portion 11A is made different between the upper layer side and the lower layer side, the base body laminate 31 is cut by the laser processing machine while gradually reducing output of the laser processing machine from the middle in the thickness direction.

In the case where the number of the pores 12 is made different between the outer layer cover portions 11Ba and 11Bb located on the upper surface side and the lower surface side in the lamination direction of the dielectric portion 9, water is applied to the upper surface side of the base laminated body 31 in spray form while the base laminated body 31 is being cut by the laser processing machine.

When water is sprayed onto the base laminated body 31 during the cutting, a barium (Ba) component contained in the ceramic green sheet 21 elutes, so that the vicinity of the surface and the cut areas of the ceramic green sheet 21 become locally rich in titanium (Ti). Titanium-rich areas is sintered less easily than areas having a higher proportion of the barium component, and thus there are more of the pores 12 in the outer layer cover portion 11B.

Next, the capacitor body 1 is produced by firing the laminated body 29 produced under predetermined conditions. When the length in the planar direction of the outer layer cover portion 11B is varied between the upper surface side and the lower surface side of the dielectric portion 9, the maximum temperature for firing the laminated body 29, obtained through the above-described method of cutting the base laminated body 31 while spraying water thereon, is varied. The continuity of the internal-electrode layers 7 also changes at this time.

Next, the external electrodes 3 are formed at end portions of the capacitor body 1 obtained by firing, including the end surfaces where the internal electrode layer 7 is exposed. A nickel plating film and a tin plating film are formed as needed. The capacitors according to the first to sixth embodiments can be obtained as a result.

Examples

The effects of the present invention were confirmed by preparing specific multilayer ceramic capacitors as described below. First, the following dielectric body powder was prepared as a material for the ceramic layers and the cover portion. Barium titanate powder, MgO powder, $Y_2O_3$ powder, and $MnCO_3$ powder were prepared as raw material powders for the dielectric body powder. When the amount of the barium titanate powder was 100 moles, 2 moles of the MgO powder, 0.5 moles of the $Y_2O_3$ powder, and 0.5 moles of the $MnCO_3$ powder were added, and furthermore, 1 part by mass of glass powder ($SiO_2$=55, BaO=20, CaO=15, $Li_2O$=10 (mol %)) was added to 100 parts by mass of the barium titanate powder in order to prepare the dielectric body powder.

Next, the wet-mixed dielectric body powder was added to a mixed solvent of toluene and alcohol in which the polyvinyl butyral resin was dissolved, and a ceramic slurry was prepared by wet-mixing using zirconia beads having a diameter of 1 mm. Then, a ceramic green sheet having an average thickness of 1 μm was produced using the doctor blade method. A ceramic green sheet having a thickness of 1.2 μm was also prepared for the capacitor according to sample No. 8.

Next, a pattern sheet was produced by forming a rectangular internal-electrode pattern on the top surface of the ceramic green sheet and then forming a ceramic pattern in the periphery of the internal-electrode pattern. A conductor paste for forming the internal-electrode pattern was prepared by kneading 20 mass % of barium titanate powder serving as a co-material and 30 mass % of an organic vehicle, constituted of 5 mass % of ethyl cellulose and 95 mass % of octyl alcohol, into 45 mass % of Ni powder using a three-roll mill. The dielectric body powder used for the ceramic green sheet was employed as the ceramic paste for the ceramic pattern.

Next, 330 layers of the created pattern sheets were stacked, and then ceramic green sheets in which the internal electrode patterns are not formed were stacked on the top and bottom surfaces of the laminated body. These were then subjected to pressurized heat-treatment in order to form the base laminated body. For sample No. 8, a pattern sheet prepared using a ceramic green sheet having a thickness of 1.2 μm was used for the first ten layers, which were not sprayed with water.

The base laminated body was then cut to predetermined dimensions using a laser processing machine to form the laminated bodies.

A cutter blade was used to cut sample No. 1 in Table 1. A laser processing machine was used for samples No. 2 to 4. Sample No. 3 was cut at 0.9× the output used for sample No. 2, and sample No. 4 was cut at 0.7× the output used for sample No. 2. Samples No. 5 to 9 were created on the basis of the conditions of sample No. 2. Samples No. 6 to 9 were cut while spraying water in mist form onto the surface of the base laminated body. Samples No. 5, 7, and 8 were cut until partway in the thickness direction under the conditions for sample No. 6, after which the cutting was carried out while gradually reducing the output of the laser processing machine to 0.1×.

Next, the prepared laminated body was degreased in the atmosphere, and was then fired for two hours at a maximum temperature of 1280° C., in an oxygen-nitrogen mixed-gas atmosphere at an oxygen partial pressure of $10^{-8}$ Pa. The capacitor body was created as a result. Sample No. 9 was created at a firing temperature 20° C. higher than the other samples (1300° C.). In this sample, the continuity of the internal-electrode layers varied in the lamination direction of the dielectric body portion. The internal-electrode layer on the outer layer cover portion side where the number of pores was higher had a lower continuity than the internal-electrode layer on the outer layer cover portion side on the opposite side, where the number of pores was lower.

The size of the capacitor body created corresponded to a 1005 type, with the size thereof being approximately 0.95 mm×0.48 mm×0.48 mm. The average thickness of the ceramic layers was 0.7 μm, and the average thickness of one of the internal-electrode layers in the dielectric body portion was 0.6 μm. The average width of the side surface cover portion and the average thickness of the outer layer cover portion were 20 μm.

The average thicknesses of one of the ceramic layers and the internal-electrode layers was found from an average value obtained by measuring both end portions (inward from the ends by approximately 1 μm) and a central portion of the internal-electrode layers at the top layer, a middle layer, and the bottom layer in the lamination direction of a cross-section of the dielectric body portion constituting the multilayer ceramic capacitor (a total of nine locations).

Next, a copper paste was applied to the end portions of the resulting capacitor body where the internal-electrode layers were exposed and heated at approximately 800° C. to form the external electrodes.

Next, a Ni plating film and a Sn plating film were formed in that order on the surfaces of the external electrodes through an electroplating method so as to produce the multilayer ceramic capacitor.

The resulting multilayer ceramic capacitors were evaluated as follows.

The number and average diameters of pores present in the dielectric body portion and the cover portion were found from a cross-section photograph (at 5000×) taken by a scanning electron microscope. The observation regions at this time were set to a dielectric body portion-side region, a central region, and a surface-side region by dividing the side surface cover portion into three equal parts in the width direction, as indicated in FIG. 1D. The surface area of each region was 100 μm². Pores present on the lines separating the regions were excluded from the count. The average diameter of the pores was calculated by drawing a circle containing approximately 30 pores in the central part of each region, the surface area of each pore was obtained by image analysis, and the diameters found from each surface area were made to correspond.

The rate of delamination was obtained by immersing the samples of the multilayer ceramic capacitors in a solder bath heated to 350° C. for approximately 1 second and then evaluating the appearance. The number of samples was 300.

A moisture resistance load test was carried out by measuring the insulation resistance after leaving the samples at 65° C., 65% RH, and an applied voltage of 6.3 V for 100 hours. For samples No. 5 to 8, the moisture resistance load test was also carried out at a temperature of 85° C. As shown in Table 1, the number of samples was set to 300, and those having an insulation resistance of not greater than $10^6 \Omega$ were judged to be poor.

The dielectric breakdown voltage was measured using an insulation resistance meter. The number of samples was 100.

Width ratios (W1/W2, W3/W4) of the outer layer cover portions were obtained from values measured using a digital microscope capable of displaying the directions indicated in FIGS. 7B and 7C as a scale. The W1/W2 ratio and the W3/W4 ratio were the same for the prepared samples.

In addition, samples in which the capacitor was mounted on the surface of a wiring board were prepared and subjected to a thermal shock test.

A wiring board including a wiring pattern formed on the surface of an FR-4 substrate was used as the wiring board. In the wiring pattern, solder plating was applied to the surface of a copper foil pattern. The capacitor was mounted on the wiring pattern using solder.

The thermal shock test was carried out under the same conditions as those under which the rate of delamination was evaluated. The number of samples was 30 of each.

TABLE 1

| Sample No. | Capacitor Structure | Side Surface Cover Portion ||||||  Delamination Rate Number | Moisture Resistance Load Test Number of Failures in Number | Dielectric Breakdown Voltage (Minimum Value) V/μm | Crack Formation Rate Number |
|---|---|---|---|---|---|---|---|---|---|---|---|
| | | Dielectric Body Portion-side Region || Central Region || Surface-side Region || | | | |
| | | Number of Pores Number | Pore Average Diameter μm | Number of Pores Number | Pore Average Diameter μm | Number of Pores Number | Pore Average Diameter μm | | | | |
| 1 | FIG. 1 | 1 | 0.2 | 3 | 0.2 | 7 | 0.2 | 12/300 | 4/300 | 26 | 5/30 |
| 2 | | 24 | 0.4 | 16 | 0.3 | 11 | 0.3 | 1/300 | 0/300 | 49 | 2/30 |
| 3 | | 35 | 0.4 | 15 | 0.2 | 12 | 0.2 | 0/300 | 0/300 | 50 | 2/30 |
| 4 | | 87 | 0.4 | 30 | 0.2 | 14 | 0.2 | 0/300 | 0/300 | 53 | 2/30 |

TABLE 2

| Sample No. | Capacitor Structure | Side Surface Cover Portion | | | | | | Outer Layer Cover Portion | |
|---|---|---|---|---|---|---|---|---|---|
| | | Dielectric Body Portion-side Region | | Central Region | | Surface-side Region | | Width Ratio (W1/W2, W3/W4) | Ratio of Number of Pores (Bottom Layer Side/ Bottom Layer Side) |
| | | Number of Pores Number | Pore Average Diameter μm | Number of Pores Number | Pore Average Diameter μm | Number of Pores Number | Pore Average Diameter μm | | |
| 5 | FIG. 2 | 23 | 0.5 | 16 | 0.4 | 12 | 0.3 | 1 | 1 |
| 6 | FIG. 4 | 27 | 0.5 | 19 | 0.4 | 14 | 0.3 | 1 | 1 |
| 7 | FIG. 5 | 25 | 0.5 | 17 | 0.4 | 12 | 0.3 | 1 | 2.1 |
| 8 | FIG. 6 | 24 | 0.5 | 11 | 0.4 | 6 | 0.3 | 1 | 2.1 |
| 9 | FIG. 7 | 24 | 0.4 | 16 | 0.3 | 11 | 0.2 | 0.9 | 2.1 |

| Sample No. | Delamination Rate Number | Number of Failures in Moisture Resistance Load Test # Number | Number of Failures in Moisture Resistance Load Test ## Number | Dielectric Breakdown Voltage (Minimum Value) V/μm | Crack Formation Rate (Number) |
|---|---|---|---|---|---|
| 5 | 1/300 | 0/300 | 4/300 | 49 | 2 |
| 6 | 1/300 | 0/300 | 2/300 | 49 | 2 |
| 7 | 1/300 | 0/300 | 2/300 | 49 | 2 |
| 8 | 0/300 | 0/300 | 1/300 | 53 | 1 |
| 9 | 0/300 | 0/300 | 1/300 | 49 | 1 |

Pores were not observed in the dielectric ceramic layers constituting the active dielectric body portion in the samples of the multilayer ceramic capacitors that were created.

In samples No. 2 to 9, there were more pores in the dielectric body portion-side region of the side surface cover portion than in the central region and the surface-side region. In these samples, the occurrence rate of delamination was not greater than 1 in 300. Additionally, the average diameter of the pores present in the side surface cover portion was greater than the average diameter of the pores present in the central region and the surface-side region.

Samples No. 2 to 9 exhibited no problems in the moisture resistance load test carried out at 65° C., 65% RH, and an applied voltage of 6.3 V for 100 hours. Furthermore, all of these samples exhibited an insulation breakdown voltage of not less than 49 V/μm.

Furthermore, with samples No. 2 to 9, the rate of cracking arising in the thermal shock test carried out after mounting the samples on a wiring board was not greater than 2 in 30.

As opposed to this, with sample No. 1, the occurrence rate of delamination was 12 in 300, and the rate of problems arising in the moisture resistance load test was 4 in 300.

REFERENCE SIGNS LIST

1 Capacitor body
3 External electrode
5 Dielectric ceramic layer
7 Internal-electrode layer
9 Dielectric body portion
11 Cover portion
11a Surface of cover portion
11A Side surface cover portion
11Aa Dielectric body portion-side region
11Ab Central region
11Ac Surface-side region
11B Outer layer cover portion
12 Pore
20, 30, 40, 50, 60 Capacitor
21 Wiring board

The invention claimed is:

1. A capacitor comprising:
a dielectric body portion comprising ceramic layers and internal-electrode layers laminated in an alternating manner; and
a cover portion provided in a periphery of the dielectric body portion,
wherein the cover portion comprises pores;
a part of the cover portion located in a position in a direction perpendicular to a lamination direction of the ceramic layers and the internal-electrode layers is a side surface cover portion; and
when the side surface cover portion is divided into three equal regions in a width direction, the regions being a dielectric body portion-side region, a central region, and a surface-side region, the number of the pores is higher in the dielectric body portion-side region than in the central region and the surface-side region,
wherein when the dielectric body portion is divided into two equal parts in the lamination direction, the number of the pores in the side surface cover portion differs between a top surface side and a bottom surface side.

2. The capacitor according to claim 1, wherein the number of the pores gradually increases from the surface-side region toward the dielectric body portion-side region.

3. The capacitor according to claim 1, wherein an average diameter of the pores is greater in the dielectric body portion-side region than in the surface-side region.

4. The capacitor according to claim 1, wherein when two parts of the cover portion located on a top surface side and a bottom surface side of the dielectric body portion in the lamination direction are each taken as an outer layer cover portion, the number of the pores differs between the two outer layer cover portions; and an outer layer cover portion of the two outer layer cover portions, the outer layer cover portion having a higher number of the pores, is located on a side where the side surface cover portion having a higher number of the pores is located.

5. The capacitor according to claim 4, wherein a ceramic layer of the ceramic layers disposed on a side where the outer layer cover portion having a higher number of pores is located is thicker than a ceramic layer of the ceramic layers disposed on a side where an outer layer cover portion of the two outer layer cover portions, the outer layer cover portion having a lower number of pores, is located.

6. The capacitor according to claim 4, wherein an internal-electrode layer of the internal-electrode layers disposed on the side where the outer layer cover portion having a higher number of pores is located has a lower continuity than an internal-electrode layer of the internal-electrode layers disposed on the side where the outer layer cover portion having a lower number of pores is located.

7. The capacitor according to claim 4, further comprising:
a pair of external electrodes opposing each other in a direction perpendicular to the lamination direction of the ceramic layers and the internal-electrode layers,
wherein the outer layer cover portion having a higher number of the pores is longer, in the direction in which the external electrodes oppose each other, than the outer layer cover portion having a lower number of the pores.

8. The capacitor according to claim 4, a pair of external electrodes opposing each other in a direction perpendicular to the lamination direction of the ceramic layers and the internal-electrode layers, wherein the outer layer cover portion having a higher number of the pores is longer, in a direction perpendicular to a direction in which the external electrodes oppose each other, than the outer layer cover portion having a lower number of the pores.

9. A module comprising a capacitor mounted on a surface of a wiring board,
wherein the capacitor is the capacitor according to claim 1.

* * * * *